United States Patent
Renaud et al.

(10) Patent No.: US 9,825,162 B2
(45) Date of Patent: Nov. 21, 2017

(54) VERTICAL POWER TRANSISTOR DEVICE, SEMICONDUCTOR DIE AND METHOD OF MANUFACTURING A VERTICAL POWER TRANSISTOR DEVICE

(75) Inventors: Philippe Renaud, Cugnaux (FR); Bruce Green, Gilbert, AZ (US)

(73) Assignee: NXP USA, INC., Austin, TX (US)

( * ) Notice: Subject to any disclaimer, the term of this patent is extended or adjusted under 35 U.S.C. 154(b) by 219 days.

(21) Appl. No.: 13/503,861

(22) PCT Filed: Nov. 19, 2009

(86) PCT No.: PCT/IB2009/056014
§ 371 (c)(1),
(2), (4) Date: Apr. 25, 2012

(87) PCT Pub. No.: WO2011/061573
PCT Pub. Date: May 26, 2011

(65) Prior Publication Data
US 2012/0217511 A1    Aug. 30, 2012

(51) Int. Cl.
*H01L 29/778* (2006.01)
*H01L 21/8252* (2006.01)
(Continued)

(52) U.S. Cl.
CPC ...... *H01L 29/7786* (2013.01); *H01L 21/8252* (2013.01); *H01L 27/0605* (2013.01);
(Continued)

(58) Field of Classification Search
CPC ............ H01L 221/8252; H01L 27/0605; H01L 29/7788; H01L 29/7786; H01L 29/66462; H01L 29/2003; H01L 29/417
(Continued)

(56) References Cited

U.S. PATENT DOCUMENTS 6,396,085 B1    5/2002  Yoshida
8,134,180 B2    3/2012  Otake et al.
(Continued)

FOREIGN PATENT DOCUMENTS

JP    2007-081154    3/2007
JP    2007115861 A   5/2007
(Continued)

OTHER PUBLICATIONS

Green, Bruce M. et al., "Cascode Connected AlGaN/GaN HEMT's on SiC Substrates," IEEE Microwave and Guided Wave Letters, vol. 10, No. 8, Aug. 2000, pp. 316-318.
(Continued)

*Primary Examiner* — Hrayr A Sayadian
(74) *Attorney, Agent, or Firm* — Bruce M. Green

(57) ABSTRACT

A vertical power transistor device comprises: a substrate formed from a III-V semiconductor material and a multi-layer stack at least partially accommodated in the substrate. The multi-layer stack comprises: a semi-insulating layer disposed adjacent the substrate and a first layer formed from a first III-V semiconductor material and disposed adjacent the semi-insulating layer. The multi-layer stack also comprises a second layer formed from a second III-V semiconductor material disposed adjacent the first layer and a heterojunction is formed at an interface of the first and second layers.

20 Claims, 4 Drawing Sheets

(51) Int. Cl.
  *H01L 27/06*   (2006.01)
  *H01L 29/66*   (2006.01)
  *H01L 29/20*   (2006.01)
  *H01L 29/417*   (2006.01)

(52) U.S. Cl.
  CPC .... *H01L 29/66462* (2013.01); *H01L 29/7788* (2013.01); *H01L 29/2003* (2013.01); *H01L 29/417* (2013.01)

(58) Field of Classification Search
  USPC ....... 257/76, 183, E21.09, E29.091; 438/478
  See application file for complete search history.

(56) References Cited

U.S. PATENT DOCUMENTS

| | | |
|---|---|---|
| 2010/0187569 A1 | 7/2010 | Renaud |
| 2012/0217511 A1* | 8/2012 | Renaud ............... H01L 21/8252 257/76 |

FOREIGN PATENT DOCUMENTS

| | | |
|---|---|---|
| JP | 2008053312 A | 3/2008 |
| JP | 2008-227356 | 9/2008 |
| JP | 2008227356 A | 9/2008 |
| JP | 2009152462 A | 7/2009 |
| JP | 2010-263087 A | 11/2010 |
| WO | 2005/079370 A2 | 9/2005 |
| WO | 2006/005025 A2 | 1/2006 |
| WO | 2006/008925 A1 | 1/2006 |
| WO | 2009007943 A1 | 1/2009 |
| WO | WO/2011/061573 | * 11/2011 |

OTHER PUBLICATIONS

Germain Marianne: "IMEC Enlarges Nitride epiwafers" Technology Power Electronics, Compound Semiconductor, Dec. 2008, pp. 23-25.

Sugimoto Masahiro et al: "Vertical Device Operation of AlGaN/GaN HEMTs on Free-Standing n-GaN Substrates" IEEE, 2007, pp. 368-372.

Ueda H. et al: "Wide-Bandgap Semiconductor Devices for Automobile Applications" CS MANTECH Conference, Apr. 24-27, 2006, Vancouver, British Columbia, Canada, pp. 37-40.

Gao Y. et al: "AlGaN/GaN Current Aperature Vertical Electron Transistors Fabricated by Photoelectrochemical Wet Etching" Electronic Letters, Jan. 9, 2003, vol. 39, No. 1, pp. 148-149.

Zhang Naiqian et al: "Large Area GaN HEMT Power Devices for Power Electronic Applications: Switching and Temperature Characteristics" IEEE 2003, pp. 233-237.

International Search Report and Written Opinion correlating to PCT/IB2009/056014 dated Aug. 31, 2010.

* cited by examiner

US 9,825,162 B2

VERTICAL POWER TRANSISTOR DEVICE, SEMICONDUCTOR DIE AND METHOD OF MANUFACTURING A VERTICAL POWER TRANSISTOR DEVICE

FIELD OF THE INVENTION

This invention relates to a vertical power transistor device of the type that, for example, comprises a vertical structure formed on a gallium nitride substrate. This invention further relates to a semiconductor die of the type that, for example, comprises a first power transistor device disposed adjacent a second power transistor device and share a common gallium nitride substrate. This invention further relates to a method of manufacturing a power transistor device, the method being of the type that, for example, comprises providing a gallium nitride substrate and growing a vertical structure.

BACKGROUND OF THE INVENTION

As a result of the increasingly important environmental disadvantages of the internal combustion engine, pressure continues to mount on automotive manufacturers to reduce carbon dioxide ($CO_2$) emissions of engines of vehicles they make. To this end, vehicle manufacturers and others are developing Hybrid Vehicle (HV) technology, Electric Vehicle (EV) technology, Fuel Cell (FC) technology and Advanced Biofuel technology, amongst other technologies as a way of reducing the carbon footprint of vehicles manufactured.

In relation to HV technology, it is known for a so-called hybrid vehicle to comprise a powertrain that is controlled by a hybrid vehicle control system. The powertrain comprises an internal combustion engine and an electric motor coupled to drive wheels via a power-split device that enables the drive wheels to be powered by the combustion engine alone, the electric motor alone or both the combustion engine and the electric motor together, allowing the combustion engine to maintain a most efficient load and speed range at a given time. The electric motor is powered by a high voltage battery. A so-called "inverter assembly" is provided that comprises an inverter and a so-called "boost converter". The inverter converts high voltage direct current from the high voltage battery of the vehicle into a three-phase alternating current for powering the electric motor. Sometimes the powertrain of the vehicle comprises more than one electric motor.

In order to provide the three-phase alternating current, the output voltage of the high voltage battery is stepped up by the boost converter from, for example, 200V to 500V. The inverter is then responsible for providing the three-phase alternating current, derived from the stepped-up voltage provided by the boost converter. In order to generate the three-phase alternative current, it is known for the inverter to comprise a bank of Insulated-Gate Bipolar Transistors (IGBTs) and parallel diodes for power modulation, the IGBTs constituting power switches.

However, for future hybrid and other electrically powered vehicles, greater demands will be made on the inverter, including low energy loss, reduced size and cost effectiveness. Furthermore, the semiconductor devices of the inverter will need to be formed from wideband gap semiconductor materials and exhibit high breakdown voltage and be able to withstand high operating temperatures.

While performance of silicon-based IGBTs is currently acceptable, these devices are less likely to perform well in respect of high current density demands, high power source voltages and high temperature operation demands that will be placed on the silicon IGBTs by future vehicle designs.

A promising candidate semiconductor material from which to fabricate power transistors is gallium nitride. However, these devices require a gallium nitride (GaN) substrate. Growth of gallium nitride substrates on a silicon substrate for subsequent separation therefrom is unfeasible due to stresses caused by lattice mismatches. In this respect, the gallium nitride layer cannot be grown sufficiently thick without the gallium nitride layer cracking when attempts are made to separate the gallium nitride layer from the silicon substrate.

To mitigate this problem, it is also known to grow the gallium nitride substrate on a Silicon Carbide substrate that has a closer lattice match with the crystalline structure of the gallium nitride grown thereon. However, the production of gallium nitride substrates of a desired thickness on Silicon Carbide substrates is costly and so a less desired manufacturing option.

As an alternative to use of Silicon Carbide, it is known to grow the gallium nitride substrate on a sapphire substrate, resulting in a more cost-effectively produced gallium nitride substrate. Indeed, a vertical power transistor device structure formed on a free-standing gallium nitride substrate grown on a sapphire substrate is described in "Vertical device operation of AlGaN/GaN HEMTs on free-standing n-GaN substrates" (Sugimoto et al, Power Conversion Conference 2007, Nagoya, 2-5 Apr. 2007). This document describes a free-standing GaN substrate having an n-GaN drift layer formed thereon. A buried-type structure having an insulated gate is then formed on the n-GaN drift layer. The gate and source are formed on a front side of the device, while a drain is formed on the back side of the device, making the device a vertical transistor device. However, such a device structure is unable to maintain a high breakdown voltage.

SUMMARY OF THE INVENTION

The present invention provides a vertical power transistor device, a semiconductor die and a method of manufacturing a vertical power transistor device as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Since the illustrated embodiments of the present invention may for the most part, be implemented using electronic components and circuits known to those skilled in the art, details will not be explained in any greater extent than that considered necessary for the understanding and appreciation of the underlying concepts of the present invention and in order not to obfuscate or distract from the teachings of the present invention.

Figure 1:
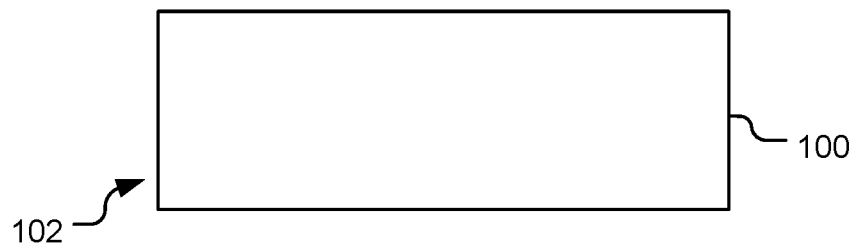
FIGS. 1 to 8 are schematic diagrams of exemplary stages of manufacture following steps of a method of manufacture of a vertical power transistor device constituting an embodiment of the invention.
Figure 9:
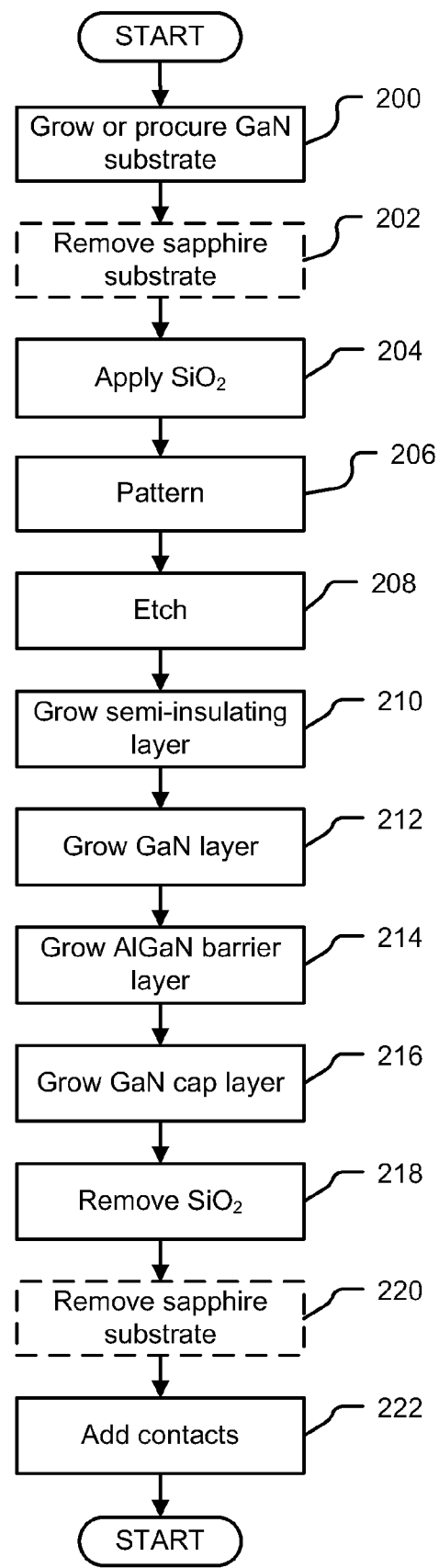
FIG. 9 is a flow diagram of exemplary steps of the method associated with FIGS. 1 to 8.

Referring to FIGS. 1 and 9, a free-standing gallium nitride substrate 100 may be provided (Step 200) for participation in the construction of a power transistor device and constitutes a wafer 102. In this example, the gallium nitride substrate may be formed by a High Vapour Process Epitaxy (HVPE) and may be grown on a sapphire substrate before separation (Step 202) from the sapphire substrate according to any suitable separation or cleavage technique known in the art. However, the skilled person should appreciate that the gallium nitride substrate 100 may remain disposed on the sapphire substrate and be processed using the processing steps described hereinbelow, after which the gallium nitride substrate 100 can be separated from the sapphire substrate. Also, the skilled person should appreciate that the gallium nitride substrate can, if desired, be formed on a silicon substrate using, for example, an atomic bonding technique. Furthermore, the gallium nitride substrate 100 need not be free-standing. Indeed, if desired, the substrate 100 may be formed from any suitable material, for example any suitable nitride of a III-V semiconductor material.

The growth process for the gallium nitride substrate 100 is prone to contamination, predominantly iron (Fe). However, in the present example, the contamination is beneficial, because the presence of the contaminant makes the gallium nitride substrate 100 conductive, and enables the substrate 100 to serve as a terminal, for example a drain of a transistor device.

Figure 2:
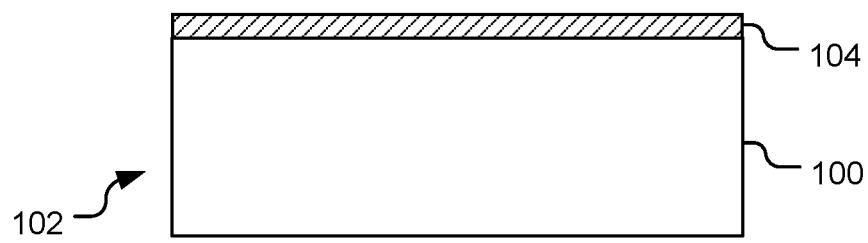
Figure 3:
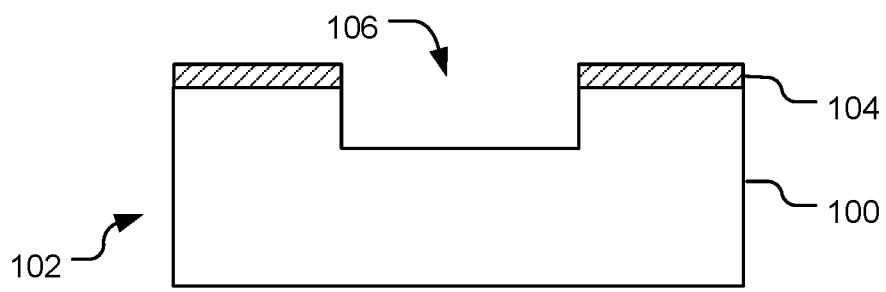

A recess 106 may be formed in the substrate 100. For example, after provision of the gallium nitride substrate, a silicon dioxide ($SiO_2$) capping layer 104 (FIG. 2) may be disposed (Step 204), for example using a Physical Vapour Deposition (PVD) technique, on the gallium nitride substrate 100 and thereafter photoresist (not shown) may be disposed on the silicon dioxide capping layer 104, for example by spin coating, and the photoresist may be patterned (Step 206) using a suitable mask. The unhardened photoresist may then be removed and the wafer may be etched (Step 208), for example by plasma etching using chlorine gas as an etchant, to form a recess 106 (FIG. 3) in the gallium nitride substrate 100 of a suitable depth of between about 1 .mu.m thick and about 2 .mu.m thick, although other depths may be used as well. The provision of the $SiO_2$ capping layer 104 serves to allow selective localised epitaxial regrowth as will be described below, and hence prevents growth outside the recess 106. Although the capping layer 104 is formed from $SiO_2$ in the present example, the capping layer 104 can be formed from silicon nitride (SiN) or any other suitable material.

Figure 4:
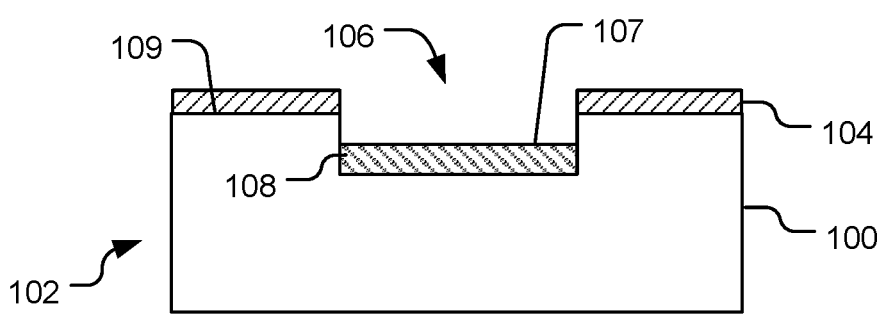

After forming the recess 106, the wafer 102 may be subjected to a multi-layer selective epitaxial re-growth process. For instance, a semi-insulating, epitaxial, layer 108 (FIG. 4) may firstly be grown (Step 210) in the recess. The semi-insulating layer 108 provides electrical isolation between the substrate 100 and layers formed (in the recess area) above the semi-insulating layer 108. More in particular, the semi-insulating layer 108 inhibits, or at least reduces, the drift of charge carriers, in a vertical direction, from the layers above to the substrate or vice versa and thus enables improving the breakdown voltage. The thickness of the semi-insulating layer 108 is less than the depth of the recess 106 such that the semi-insulating layer 108 does not extend out of the recess, in this example above the surface 109 of the of the substrate 100. The layer may for example have a thickness of between about 1 .mu.m and about 1.5 .mu.m in the recess 106 such that a top surface 107 of the semi-insulating layer 108 is below the surface 109 of the substrate 100. In this example, the growth technique may be Molecular Beam Epitaxy (MBE) or Metal Organic Chemical Vapour Deposition (MOCVD), the semi-insulating layer 108 being recessed in the substrate 100. In this example, the semi-insulating layer 108 is p-type doped gallium nitride, where the dopant is magnesium (Mg). However, other dopants can be employed, for example, carbon (C) or iron (Fe) to increase the electrical resistance of the semi-insulating layer 108 or to develop a p-type behaviour by the layer. Alternatively, the semi-insulating layer 108 can be a layer of aluminium gallium nitride (AlGaN), indium gallium nitride (InGaN), aluminium indium nitride (AlInN), or any other suitable, doped or undoped, semi-insulating material.

Figure 5:
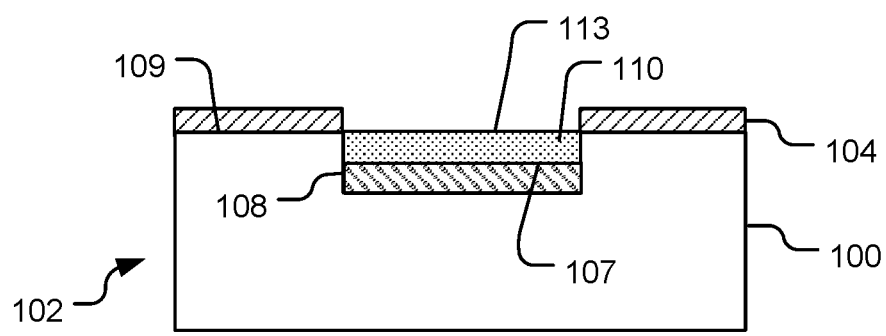

After disposing the semi-insulating layer 108, a first gallium nitride layer 110 (FIG. 5) may be grown (Step 212) on top of the semi-insulating layer 108. A suitable thickness is found to be between about 200 nm and about 0.5 .mu.m, although other thicknesses may be used as well. The gallium nitride layer 110 is adjacent the semi-insulating layer 108. As shown, the GaN layer 110 extends over the top surface 107 of the semi-insulating layer 108 in the recess 106. A top surface 113 of the GaN layer 110 is level with, or below, the surface 109. To form the gallium nitride layer 110, any suitable growth technique can be employed, for example MBE or MOCVD. In the shown example, the layer 110 is a not intentionally doped GaN layer. Of course, the first layer 110 can be formed from any other suitable material, for example any suitable III-V semiconductor material, such as a III-nitride semiconductor material. The III-nitride material or materials used may for example be one or more materials in the group consisting of: binary III-nitride material, ternary III-nitride material, quaternary III-nitride material, GaN, AlGaN InGaN, AlInN, AlInGaN, and be epitaxial grown III-nitride materials.

As can be seen in this example, the semi-insulating layer 108 and the GaN layer 110 are substantially enclosed by the (free-standing) gallium nitride substrate 100. In this regard, in a horizontal plane, i.e. parallel to the surface 109, the semi-insulating layers 108 and the GaN layer 110 are surrounded by the recess sides 111 of the substrate 100, and the bottom of the recess 106 in which the layers 108, 110 are disposed is closed by the substrate 100 as well. The top of the recess 106 is not, however, covered by the substrate 100 and in this example is open in relation to the substrate 100.

Figure 6:
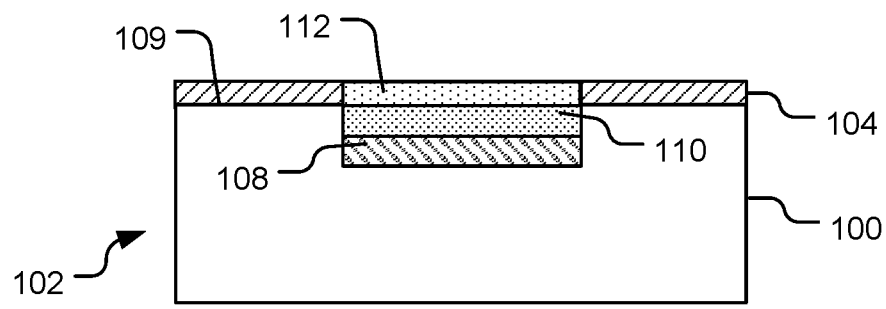

Thereafter, a second barrier, layer 112 (FIG. 6) formed of, for example aluminium gallium nitride, e.g. not intentionally doped, may be grown (Step 214). An interface between the GaN layer 110 and the barrier layer 112 serves as a heterojunction and so the power transistor device being formed is a High Electron Mobility Transistor (HEMT) or a Heterostructure Field Effect Transistor (HFET). The layer 112 may for example be grown using the same epitaxy process (MOCVD or MBE) on the gallium nitride layer 110. A suitable thickness of the barrier layer 112 was found to be between about 15 nm and about 30 nm although other thicknesses may be used as well. The aluminium gallium nitride barrier layer 112 may be disposed adjacent the gallium nitride layer 110 and may for example be provided on top of the layer 110. The atomic percentage of aluminium in the aluminium gallium nitride can be of the order of about 20% to 30%, which can be expressed by the equation: $Al_xGa_{1-x}N$, where x is between about 0.20 and about 0.30. Alternatively, the barrier layer 112 can be formed from indium gallium nitride (InGaN), the atomic percentage of indium being between about 10% and about 20%, which can be expressed by the equation: $In_xGa_{1-x}N$, where x is between about 0.1 and about 0.2. As a further alternative, the barrier layer 112 can be formed from aluminium indium nitride (AlInN), the atomic percentage of indium being between about 10% and about 20%, which can be expressed by the equation: $Al_{1-x}In_xN$, where x is between about 0.1 and about 0.2. The skilled person should appreciate that the above materials are examples of suitable III-V semiconductor material and any other suitable materials to form a heterojunction can be employed, for example having different band-gaps causing a formation of a potential well at the interface or having different a lattice constants causing an piezoelectric polarization in a transversal direction from the interface towards the substrate. For example, other suitable III-V semiconductor materials may be used, such as (alloys, compounds or mixtures of) a III-nitride, such as nitride of Al and/or In and/or Ga. The III-nitride material or materials used may for example be one or more materials in the group consisting of: binary III-nitride material, ternary III-nitride material, quaternary III-nitride material, GaN, AlGaN InGaN, AlInN, AlInGaN, and be epitaxial grown III-nitride materials.

A gallium nitride cap layer 114 (FIG. 7) may be grown (Step 216) on the aluminium gallium nitride barrier layer 112 so that the gallium nitride cap layer 114 is adjacent the aluminium gallium nitride barrier layer 112 in order to prevent oxidation of the AlGaN barrier layer 112. After formation of the multi-layer stack 116, the silicon dioxide capping layer 104 may be removed (Step 218), and if not already removed, the sapphire substrate (not shown) may be removed (Step 220) in a like manner to that mentioned above so that the gallium nitride substrate 100 becomes a free-standing gallium nitride substrate 100.

Figure 7:
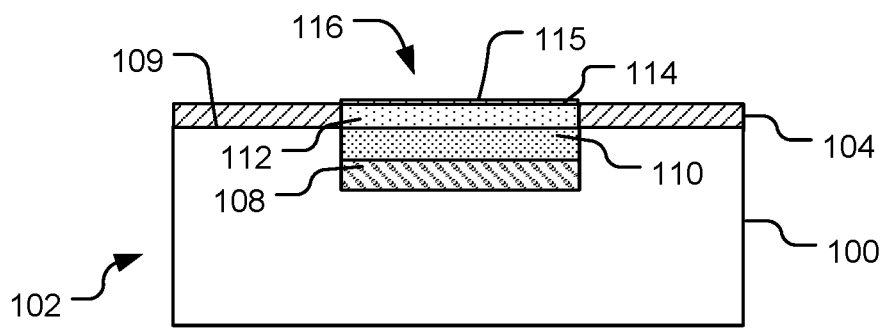

The semi-insulating layer 108, the gallium nitride layer 110, the aluminium gallium nitride layer 112 and the gallium nitride cap layer 114 formed by selective epitaxial re-growth constitute a multi-layer stack 116. The multi-layer stack 116 may be associated with the gallium nitride substrate 100, the multi-layer stack 116 being formed in the gallium nitride substrate 100. As can be seen in FIG. 7, a top surface 115 of the multi-layer stack 116 is level with, or extends above the edge of the recess, i.e. above the surface 109 of the substrate 100. As shown for example in FIG. 8, the semi-insulating layer 108 separates, in a vertical direction from the surface 109 to the bottom of the substrate 100, the other layers in the multi-layer stack 116 from the substrate 100. Thus, the barrier layer inhibits, or at least reduces, in the recess 106, direct current flow in a vertical direction towards the substrate from or towards the stack 116

Figure 8:
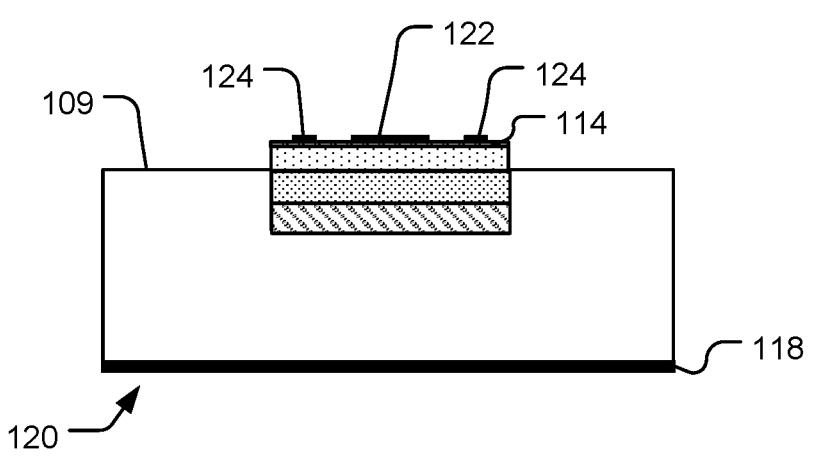

To direct current flow near the interface between the GaN layer 110 and the barrier layer 112 laterally and then vertically in the GaN substrate 100, the interface between the GaN layer 110 and the barrier layer 112 is located level with or below the edge of the recess 106, i.e. in this example below surface 109 of the substrate 100 in order to ensure electrical connection with the substrate 100. In this example, the interface is level with the surface 109 and so barrier layer 112 and the cap layer 114 are situated above the surface 109. However, if the interface is disposed a sufficient distance below the surface 109, the remaining layers of the multi-layer stack 116 can be formed such that a top surface of the multi-layer stack 116 is level with the surface 109. As shown in FIG. 8, a drain contact 118 may be formed (Step 222) on a back side 120 of the substrate 100. The drain contact 118 is electrically connected to the GaN substrate 100 and in case of the GaN substrate being provided on other substrates, e.g. on a Si substrate, a connector may be provided through the other substrate, such as a metal via of a local doping which makes the other substrates locally conduction. A source contact 122 and gate contacts 124 may be formed on the gallium nitride cap layer 114 using any suitable metallisation technique. The gate contact 124 can be a Schottky contact, for example formed from nickel, platinum, molybdenum or iridium. Alternatively, the gate contact 124 can be a Metal-Insulator-Semiconductor (MIS) contact, for example silicon dioxide, silicon nitride, or hafnium oxide. The source and drain contacts may be ohmic contacts formed from a combination of tantalum, titanium and aluminium according to any suitable technique known in the art and may be subject to rapid thermal anneal to diffuse metallic elements within the GaN layer to form the so-called ohmic contact.

The structure of the power transistor device is such that the power transistor device is a "normally on" type device and so operation of the power transistor device will now be described accordingly. However, the skilled person should appreciate that the power transistor device can be formed so as to be of a "normally off" type.

In operation, a negative bias voltage, $V_{GS}$, of −5V applied between the gate and the source terminals 122, 124, results in the power transistor device being placed in an OFF state. When in an ON state, a quantum well of about 25 Å in thickness caused by spontaneous and piezoelectric polarisation at the heterojunction results in a 2 Dimensional Electron Gas (2DEG) region forming below the gate terminal 122 and the interface between the GaN layer 110 and the barrier layer 112. The 2DEG region constitutes a lateral drift region. However, when the −5V bias voltage, $V_{GS}$, is applied, the 2DEG region is depleted and no electrical current flows resulting in the OFF state.

When the bias voltage, $V_{GS}$, is increased towards 0V, the depletion of the 2DEG region reduces and the 2DEG region fills with electrons. Due to the presence of the very resistive semi-insulating layer 108, electrical current begins to flow laterally towards the regions of the substrate 100 adjacent to the recess, formally the recess sides 111, before flowing down through the substrate 100 towards the drain contact 118. As the bias voltage, $V_{GS}$, is made increasingly positive, the 2DEG region becomes increasingly undepleted and an accumulation of electrons forms in the 2DEG region and contributes to an increased drain current.

In another embodiment (FIG. 10), in addition to the first multi-layer stack 116 formed in the free-standing gallium nitride substrate 100, a second multi-layer stack 126 may be also formed side-by-side in the horizontal direction in the free-standing gallium nitride substrate 100, the first and second multi-layer stacks 116, 126 being separated by a vertical region of the gallium nitride substrate 100. To achieve this, the patterning (Step 206) performed may define a location of a second recess 128 that may be etched in the free-standing gallium nitride substrate 100 at the same time as the first recess 106 was etched. The second recess 128 may then be filled with the second multi-layer stack 126 at the same time as the first multi-layer stack 116 is formed in a first recess 106. Hence, the free-standing gallium nitride substrate 100 constitutes a common substrate in this example in which the first and second multi-layer stacks 116, 126 are formed. Consequently, a first power transistor device and a second power transistor device are formed on/in the wafer 102, the first multi-layer stack 116 being associated with the first power transistor device and the second multi-layer stack 126 being associated with the second power transistor device.

After formation of the first and second multi-layer stacks 116, 126, a connecting region 130 may be formed between the first and second multi-layer stacks 116, 126, in this example between opposing sides of the first and second multi-layer stacks 116, 126, in order to bridge the first and second multi-layer stacks 116, 126. In this respect, prior to formation of the gate and source contacts, the surface of the wafer 102 may be patterned, for example using photoresist, and the location of the connecting region 130 is defined. The connecting region 130 may then be formed by ion implantation to form an $n^+$ region 132 that is less than about 0.5 μm thick, for example using silicon ions. The $n^+$ region 132 bridges the gallium nitride layers 110, the aluminium gallium nitride barrier layers 112 and the gallium nitride cap layers 114 of the first and second power transistor devices. In this example, the connecting region may be spaced from the gate contacts 124 by between about 10 μm to about 30 μm. If desired, the $n^+$ region 132 can be divided into two separate regions respectively adjacent each of the first and second multi-layer stacks 116, 126. Consequently, in another embodiment, multiple transistor devices can be placed in parallel to form a network or a two-dimensional array for high current applications. Hence, although the above embodiments have been described in the context of the $n^+$ ohmic region 132 being a single region bridging two multi-layer stacks, the skilled person should appreciate that the provision of individual non-bridging regions of $n^+$ ohmic regions disposed adjacent a multi-layer stack in the manner described above, in relation to the extent to which the $n^+$ ohmic region extends with respect to the side surface of a given multi-layer stack, is contemplated.

In operation, each of the first and second power transistor devices, when in the ON state, generates a respective lateral drift region beneath the interface between the AlGaN barrier 112 and the GaN layer 110 and opposite the gate 124, extending towards the $n^+$ region 132. In this regard, each of the first and second power transistor devices operate in a like manner to that described above in relation to the formation of a single power transistor device. However, the presence of the connecting region 130 serves to improve transfer of electrical current from the lateral drift regions of the first and second power transistor devices into a vertical drift region 134 located in the substrate 100 between the first and second multi-layer stacks 116, 126. In this regard, the connecting region 130 electrically couples the heterojunctions of the first and second multi-layer stacks to the vertical drift region 134 of the substrate 100. It should be appreciated that if one were considering a single power transistor device, the power transistor device generates its own lateral drift region, and where a non-bridging $n^+$ ohmic region is disposed adjacent the multi-layer stack of the single power transistor device, the presence of the $n^+$ region 132 also serves to improve transfer of electrical current from the lateral drift region of the power transistor devices to the vertical drift region 134.

In a further embodiment (FIG. 11), the connecting region 130 may be supplemented with an ohmic contact 136 formed over the $n^+$ region 132 so that the ohmic contact 136 is disposed adjacent the $n^+$ region 132. The ohmic contact 136 can be implemented within the same process steps used to form the source contact 122. The transfer of electrical current from the lateral drift regions of the first and second power transistor devices to a vertical drift region 134 is therefore further improved. As described above, in addition to the $n^+$ ohmic region being arranged as two separate regions, the ohmic contact 136 can also be disposed as two separate ohmic contacts, each being respectively adjacent the first and second multi-layer stacks 116, 126.

It is thus possible to provide a vertical power transistor device and a method of manufacture thereof that results in improved bandgap, for example about 3.5 eV, and hence an increased off-state breakdown voltage. The device also benefits from improved carrier mobility. The provision of the connecting region 130 also serves to spread the electric field in three dimensions between the gate and drain of the device when in the off-state, thereby also supporting an improved breakdown voltage, which results in reduced die area occupation per device as well as optimisation of the breakdown voltage verses normalised on-resistance of the vertical power transistor device. Additionally, the provision of a connecting region between stacks in a common substrate reduces electrical discontinuity between the 2 Dimensional Electron Gas and the vertical drift region of neighbouring devices, thereby facilitating transfer of electrical current from the lateral drift regions of the neighbouring devices to the vertical drift region supported by the common substrate. Hence, high resistance between the lateral drift region and the vertical drift region is reduced without sacrificing drain-source electrical isolation.

Of course, the above advantages are exemplary, and these or other advantages may be achieved by the invention. Further, the skilled person will appreciate that not all advantages stated above are necessarily achieved by embodiments described herein.

In the foregoing specification, the invention has been described with reference to specific examples of embodiments of the invention. It will, however, be evident that various modifications and changes may be made therein without departing from the broader spirit and scope of the invention as set forth in the appended claims.

Figure 10:
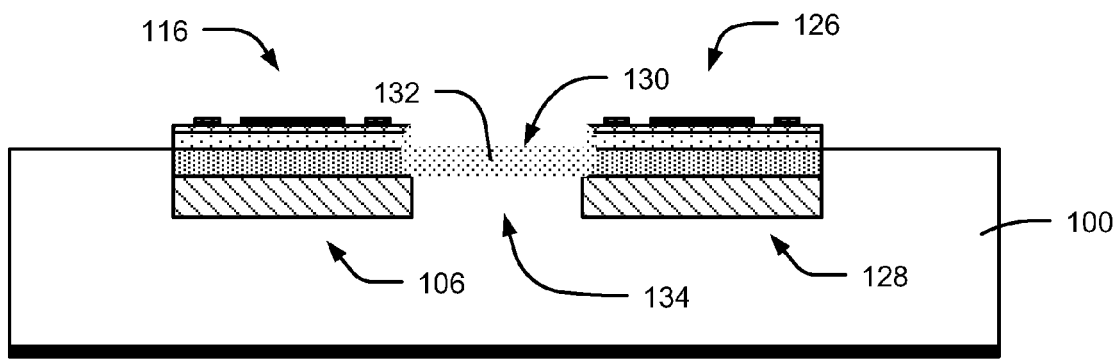
FIG. 10 is a schematic diagram of an example of neighbouring vertical power transistor devices constituting another embodiment of the invention.
Figure 11:
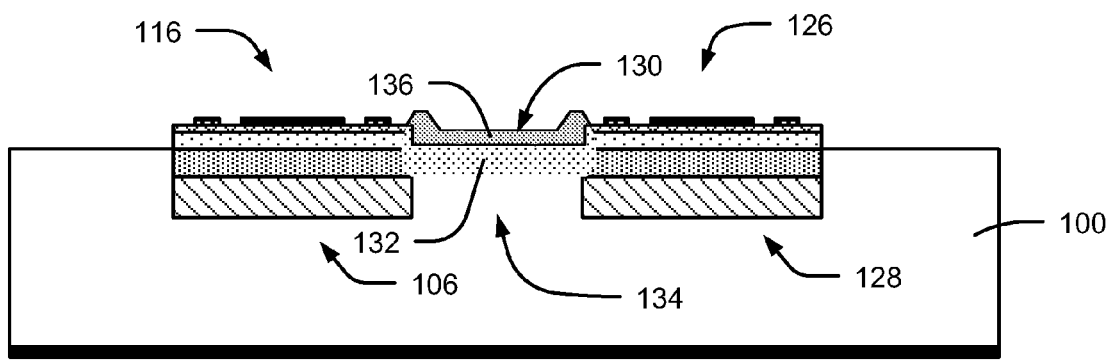
FIG. 11 is a schematic diagram of another example of neighbouring vertical power transistor devices constituting a further embodiment of the invention.

For example, other passive or active devices, may be provided on the substrate, such as resistors, diodes, capacitor and the like together with the transistor device or devices. Furthermore, other layers may be provided on Also for example, in one embodiment, the illustrated examples may be implemented as circuitry located on a single integrated circuit or within a same device. For example, as illustrated in the embodiments of FIGS. 10 and 11, the first and second multi-layer stacks 116, 126 share the common free-standing gallium nitride substrate 100. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage. the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The invention claimed is:
1. A vertical power transistor device comprising:
   a substrate formed from a III-V semiconductor material; and
   a multi-layer stack at least partially accommodated in a recess of the substrate, the multi-layer stack comprising:
      a semi-insulating layer grown on and in contact with the substrate, within the recess with a thickness less than a depth of the recess;
      a first layer formed from a first III-V semiconductor material and grown on and in contact with the semi-insulating layer in the recess;
      a second layer formed from a second III-V semiconductor material and grown on and in contact with the first layer, an interface between the first and second layers being level with or below a top edge of the substrate;
      and
      a heterojunction formed at the interface;
         wherein the resistivity of the semi-insulating layer inhibits electrical current flow from the first layer through the semi-insulating layer to the substrate and electrical current is to flow laterally from the multi-layer stack towards regions of the substrate adjacent to sides of the recess before the electrical current flows vertically through the substrate.
2. A device as claimed in claim 1, wherein the semi-insulating layer is formed from a III-V semiconductor material from a group consisting of: III-nitride material, binary III-nitride material, ternary III-nitride material, quaternary III-nitride material, gallium nitride comprising a p-type dopant, AlGaN, InGaN and AlInN.
3. A device as claimed in claim 1, wherein the first layer and/or the second layer is formed from a, doped or not intentionally doped, III-V semiconductor material selected from a group consisting of: III-nitride material, binary III-nitride material, ternary III-nitride material, quaternary III-nitride material, GaN, AlGaN, InGaN; AlInN.
4. A device as claimed in claim 1, wherein the second layer is a barrier layer.
5. A device as claimed in claim 4, wherein the barrier layer is formed from a material selected from a group consisting of: AlGaN, InGaN and AlInN.

6. A device as claimed in claim 4, wherein the barrier layer is formed from $Al_xGa_{1-x}N$, where x is between about 0.20 and about 0.30.
7. A device as claimed in claim 4, wherein the multi-layer stack comprises a gallium nitride cap layer disposed adjacent the barrier layer.
8. A device as claimed in claim 1, wherein the multi-layer stack is an epitaxial multi-layer stack.
9. A device as claimed in claim 1, wherein the semi-insulating layer and the first layer are substantially enclosed by the substrate.
10. A device as claimed in claim 1, wherein the substrate comprises the recess and the multi-layer stack is at least partially situated in the recess.
11. A device as claimed in claim 1, wherein at least the semi-insulating layer is recessed in the substrate.
12. A semiconductor die comprising a first power transistor device comprising a vertical power transistor device as claimed in claim 1 and a second power transistor device comprising the vertical power transistor device as claimed in claim 1, wherein the substrate of the first and second power transistor devices is common to both of the first and second power transistor devices, the substrate being capable of supporting a vertical drift region between a first multi-layer stack of the first power transistor device and a second multi-layer stack of the second power transistor device; and the die further comprises:
   a connecting region between opposing sides of the first and second multi-layer stacks of the first and second power transistor devices for electrically coupling the heterojunctions of the first and second multi-layer stacks to the vertical drift region.
13. A die as claimed in claim 12, wherein the connecting region comprises an ion implantation region arranged to bridge the first layer of the first multi-layer stack and the first layer of the second multi-layer stack.
14. A die as claimed in claim 13, wherein the ion implantation region bridges the second layer and the cap layer of the first multi-layer stack and the second layer and the cap layer of the second multi-layer stack.
15. A die as claimed in claim 13, wherein the connecting region further comprises an ohmic contact disposed adjacent the ion implantation region.
16. A method of manufacturing a vertical power transistor device, comprising:
   providing a substrate formed from a nitride of a III-V semiconductor material;
   etching a recess in the substrate;
   growing a semi-insulating layer within the recess and in contact with the substrate with a thickness less than a depth of the recess;
   growing a first layer formed from a first III-V semiconductor material within the recess of the substrate and in contact with the semi-insulating layer; and
   growing a second layer formed from a second III-V semiconductor material on a top of the first layer, an interface between the first and second layers being level or below a top edge of the recess, and
   wherein growing the second layer results in forming a heterojunction at the interface, and
   wherein, during operation of the device, the semi-insulating layer is configured to force electrical current to flow laterally through the heterojunction towards regions of the substrate adjacent to sides of the recess before the electrical current flows vertically through the substrate.

17. A method as claimed in claim 16, further comprising:
etching another recess in the substrate, the recess and the another recess being separated in a horizontal direction by a vertical region of the substrate.

18. A method as claimed in claim 16, further comprising: forming another multi-layer stack in the another recess.

19. A method as claimed in claim 18, further comprising:
forming a connecting region so as to bridge opposing sides of the multi-layer stack and the another multi-layer stack and electrically couple the respective heterojunctions of the multi-layer stack and the another multi-layer stack to the substrate.

20. A method as claimed in claim 16, further comprising: forming the substrate as a free-standing substrate.

* * * * *